US012581692B2

(12) United States Patent
Liang et al.

(10) Patent No.: US 12,581,692 B2
(45) Date of Patent: Mar. 17, 2026

(54) TRANSISTOR DEVICES WITH DOUBLE-SIDE CONTACTS

(71) Applicant: QUALCOMM Incorporated, San Diego, CA (US)

(72) Inventors: Qingqing Liang, San Diego, CA (US); Haining Yang, San Diego, CA (US); Jonghae Kim, San Diego, CA (US); Periannan Chidambaram, San Diego, CA (US); George Pete Imthurn, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 626 days.

(21) Appl. No.: 17/934,400

(22) Filed: Sep. 22, 2022

(65) Prior Publication Data

US 2024/0105797 A1      Mar. 28, 2024

(51) Int. Cl.
| | |
|---|---|
| *H10D 30/67* | (2025.01) |
| *H10D 30/01* | (2025.01) |
| *H10D 30/62* | (2025.01) |
| *H10D 84/01* | (2025.01) |
| *H10D 84/03* | (2025.01) |

(52) U.S. Cl.
CPC ....... *H10D 30/6735* (2025.01); *H10D 30/024* (2025.01); *H10D 30/6211* (2025.01); *H10D 30/6219* (2025.01); *H10D 84/013* (2025.01); *H10D 84/0158* (2025.01); *H10D 84/038* (2025.01)

(58) Field of Classification Search
CPC ........... H10D 30/6735; H10D 30/6211; H10D 84/013; H10D 84/0158; H10D 30/024; H10D 30/6219
See application file for complete search history.

(56) References Cited

U.S. PATENT DOCUMENTS

| | | | |
|---|---|---|---|
| 11,195,930 B1 | 12/2021 | Chen et al. | |
| 11,482,595 B1 * | 10/2022 | Chiu ................. | H10D 30/6757 |
| 11,735,585 B2 | 8/2023 | Hong et al. | |
| 2019/0312117 A1 * | 10/2019 | Qi ..................... | H01L 21/02532 |

(Continued)

FOREIGN PATENT DOCUMENTS

| | | |
|---|---|---|
| EP | 4141912 A1 | 3/2023 |
| EP | 4235764 A1 | 8/2023 |

OTHER PUBLICATIONS

International Search Report and Written Opinion—PCT/US2023/074748—ISA/EPO—Jan. 19, 2024.

*Primary Examiner* — Christine A Enad
(74) *Attorney, Agent, or Firm* — Muncy, Geissler, Olds & Lowe, P.C.

(57)      ABSTRACT

Disclosed are apparatuses including transistor and methods for fabricating the same. The transistor may include a drain substantially enclosed in a drain silicide layer, wherein an integral drain via portion of the drain silicide layer is coupled to a second drain contact and wherein a first drain via couples the drain silicide layer to a first drain contact. The transistor may include a source substantially enclosed in a source silicide layer, wherein an integral source via portion of the source silicide layer is coupled to a second source contact and wherein a first source via couples the source silicide layer to a first source contact. The transistor may include a gate disposed between the source and the drain.

24 Claims, 17 Drawing Sheets

(56) References Cited

U.S. PATENT DOCUMENTS

| | | |
|---|---|---|
| 2019/0326395 A1 | 10/2019 | Ando et al. |
| 2021/0119031 A1 | 4/2021 | Song et al. |
| 2021/0265220 A1 | 8/2021 | Lee et al. |
| 2021/0313424 A1 | 10/2021 | Chiu et al. |
| 2021/0375722 A1* | 12/2021 | Kim ..................... H10D 84/038 |
| 2021/0375761 A1 | 12/2021 | Chang et al. |
| 2022/0037497 A1 | 2/2022 | Chung et al. |
| 2022/0052157 A1* | 2/2022 | Chang ................. H10D 64/256 |
| 2022/0093448 A1 | 3/2022 | Yu et al. |
| 2022/0157938 A1 | 5/2022 | Lin et al. |
| 2022/0271138 A1 | 8/2022 | Su et al. |
| 2023/0121408 A1 | 4/2023 | Yu et al. |
| 2023/0215767 A1* | 7/2023 | Xie ........................ H10D 30/43 |
| | | 257/329 |
| 2023/0253313 A1 | 8/2023 | Wang et al. |
| 2024/0055501 A1* | 2/2024 | Lin ..................... H10D 64/251 |
| 2024/0105728 A1 | 3/2024 | Liang |

* cited by examiner

100

AA'

CC'

BB'

100

164

152

154

150

156

158

162

X-section BB' view

X-section AA' view

X-section CC' view

200

200

X-section BB' view

X-section AA' view

X-section CC' view

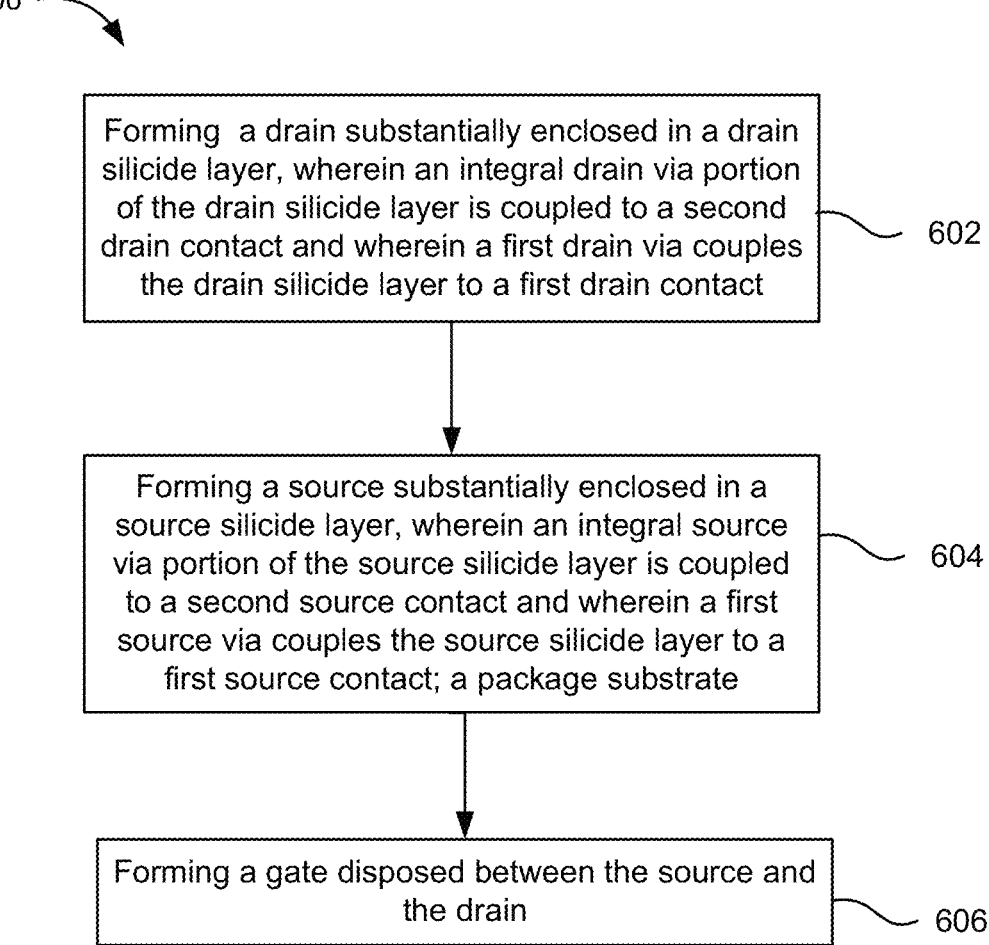

600

Forming a drain substantially enclosed in a drain silicide layer, wherein an integral drain via portion of the drain silicide layer is coupled to a second drain contact and wherein a first drain via couples the drain silicide layer to a first drain contact                602

Forming a source substantially enclosed in a source silicide layer, wherein an integral source via portion of the source silicide layer is coupled to a second source contact and wherein a first source via couples the source silicide layer to a first source contact; a package substrate                604

Forming a gate disposed between the source and the drain                606

*FIG. 6*

TRANSISTOR DEVICES WITH DOUBLE-SIDE CONTACTS

BACKGROUND OF THE DISCLOSURE

1. Field of the Disclosure

Aspects of the disclosure relate generally to three-dimensional integrated circuit (3DIC) devices including transistor devices with double side contacts and further including double-side contacts in FinFET and Gate-All-Around (GAA) devices.

2. Description of the Related Art

Integrated circuit technology has achieved great strides in advancing computing power through miniaturization components such as semiconductor transistors. The progression of semiconductors have progressed from bulk substrates and planar CMOS, FinFETs, nanowires or nanoribbons, FinFET 3D stacking to nanowire or nanoribbon 3D stacking. 3DIC is one of the main trends for very large scale integration (VLSI) devices in the More Moore era. Through-silicon via is an important process module that allows 3D stacking. One industry trend is to vertically stack active chips (e.g., system on chip (SOC)/high bandwidth memory (HBM)) using thru-silicon-vias (TSV) or buried power rail (BPR). However, the conventional contact configuration limits the ability for high density connections in a stacked configuration.

Accordingly, there is a need for systems, apparatuses and methods that overcome the deficiencies of conventional designs including the methods, systems and apparatuses for FinFET and Gate-All-Around (GAA) devices provided herein in the following disclosure.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

One or more aspects include an apparatus including a transistor comprising: a drain substantially enclosed in a drain silicide layer, wherein an integral drain via portion of the drain silicide layer is coupled to a second drain contact and wherein a first drain via couples the drain silicide layer to a first drain contact; a source substantially enclosed in a source silicide layer, wherein an integral source via portion of the source silicide layer is coupled to a second source contact and wherein a first source via couples the source silicide layer to a first source contact; and a gate disposed between the source and the drain.

One or more aspects include a method for fabricating an apparatus including a transistor comprising: forming a drain substantially enclosed in a drain silicide layer, wherein an integral drain via portion of the drain silicide layer is coupled to a second drain contact and wherein a first drain via couples the drain silicide layer to a first drain contact; forming a source substantially enclosed in a source silicide layer, wherein an integral source via portion of the source silicide layer is coupled to a second source contact and wherein a first source via couples the source silicide layer to a first source contact; and forming a gate disposed between the source and the drain.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

FIG. 6 illustrates a flowchart of a method for manufacturing a device in accordance with one or more aspects of the disclosure.

Figure 1A:
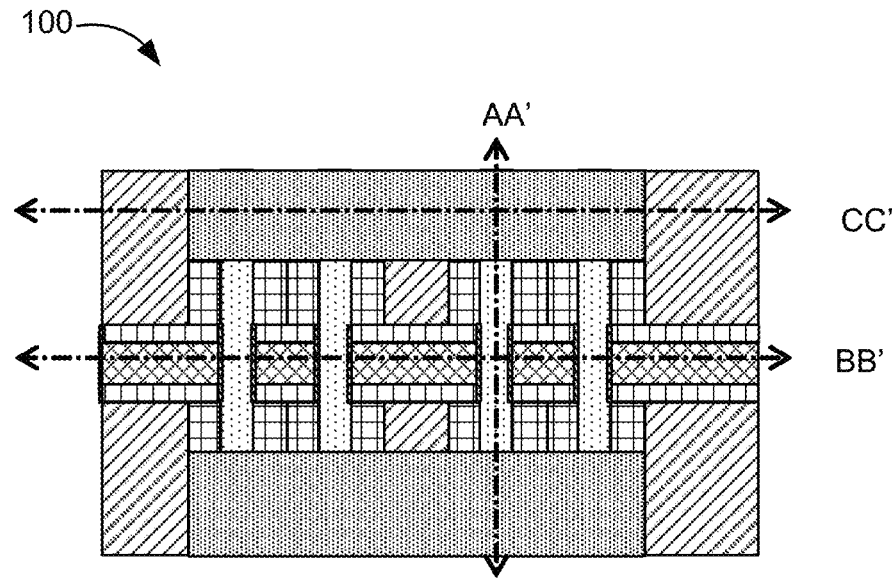
FIG. 1A illustrates a partial top down view of an apparatus in accordance with one or more aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage, or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1A illustrates a partial top down view of an apparatus 100 in accordance with one or more aspects of the disclosure. The top down view is of the wafer post flip. The apparatus, in some aspects, may be or include one or more three-dimensional integrated circuit (3DIC) devices. The top down view illustrates a plurality of transistors in a cell configuration, with cross-sectional lines AA', BB' and CC', which will be detailed in the following description.

Figure 1B:
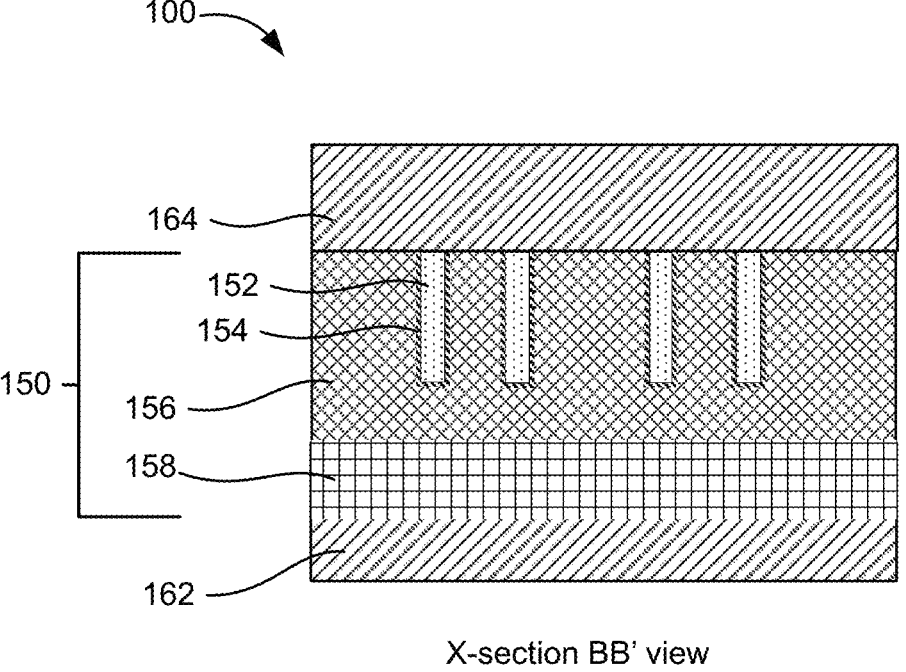
FIG. 1B illustrates a partial cross-sectional view of the apparatus of FIG. 1A in accordance with one or more aspects of the disclosure.

FIG. 1B illustrates a partial cross-sectional view of the apparatus 100 of FIG. TA in accordance with one or more aspects of the disclosure. Specifically, the cross-sectional view is illustrated along the BB' line of FIG. TA, which includes a plurality of gate structures 150. A gate poly 156 may be a heavily doped Polysilicon (Poly) and includes a plurality of gate channels 152, which in some aspects are a lightly doped Silicon (Si) and are surrounded by a gate oxide 154, which in some aspects is Silicon Dioxide ($SiO_2$). A gate contact layer 158, which in some aspects is silicide, is disposed on the gate poly 156. A frontside dielectric 162 is disposed on the plurality of gate structures 150 and backside dielectric 164 is disposed on an opposite side of the plurality of gate structures 150.

Figure 1C:
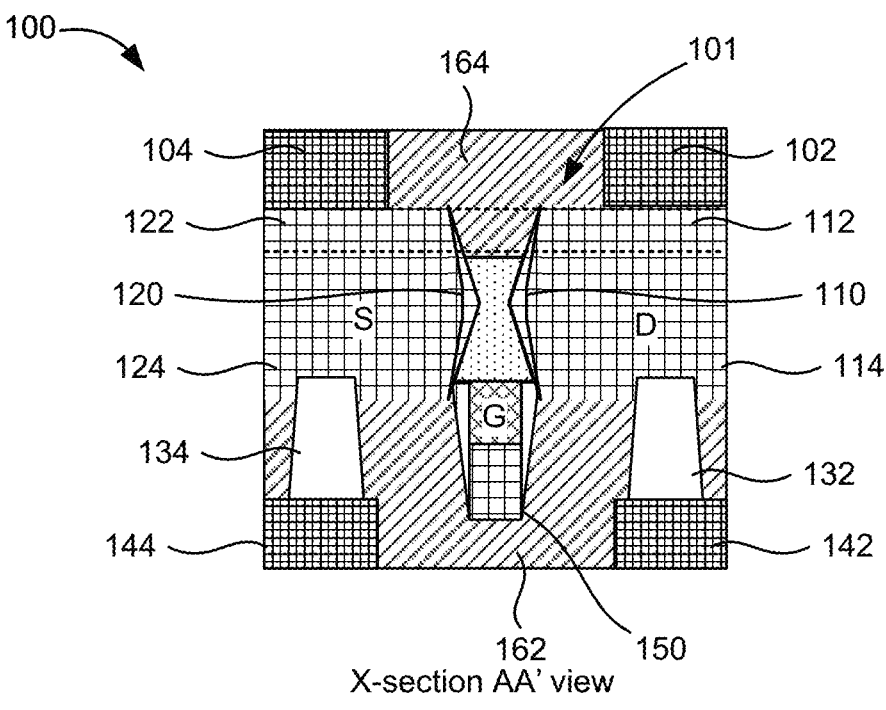
FIG. 1C illustrates a partial cross-sectional view of the apparatus of FIG. 1A in accordance with one or more aspects of the disclosure.

FIG. 1C illustrates a partial cross-sectional view of the apparatus 100 of FIG. 1A in accordance with one or more aspects of the disclosure. Specifically, the cross-sectional view is illustrated along the AA' line of FIG. 1A. The apparatus 100 includes a transistor 101 that has a drain 110 substantially enclosed in a drain silicide layer 114. An integral drain via portion 112 of the drain silicide layer 114 is coupled to a second drain contact 102 (which is part of a backside metallization structure discussed in further detail below). A first drain via 132 couples the drain silicide layer 114 to a first drain contact 142 (which is part of a frontside metallization structure discussed in further detail below). A source 120 is substantially enclosed in a source silicide layer 124. An integral source via portion 122 of the source silicide layer 124 is coupled to a second source contact 104 (which is part of a backside metallization structure discussed in further detail below). A first source via 134 couples the source silicide layer 124 to a first source contact 144 (which is part of a frontside metallization structure discussed in further detail below). A gate structure 150 is disposed between the source 120 and the drain 110. The frontside dielectric 162 is disposed on the frontside of transistor 101 and the backside dielectric 164 is disposed on an opposite side of the transistor 101. In some aspects, a thickness (indicated by the dashed lines) of the integral drain via portion (112) and the integral source via portion (122) are each on the order of 5 nm to 40 nm. In some aspects, the integral source via portion 122 is in direct contact with the second source contact 104 and the integral drain via portion 112 is in direct contact with the second drain contact 102. In some aspects, the drain silicide layer 114 and source silicide layer 124 each have a substantially uniform thickness. In some aspects, the drain silicide layer 114 and source silicide layer 124 have substantially a same thickness. In some aspects, the integral drain via portion 112 is embedded in the drain silicide 114 and the drain 110 (e.g., the integral drain via portion 112 is formed as part of the drain layer). In some aspects, the integral drain via portion 112 is an extended portion of the drain silicide 114 and the drain 110 (e.g., the integral drain via portion 112 is formed as an additional portion to the drain layer).

Figure 1D:
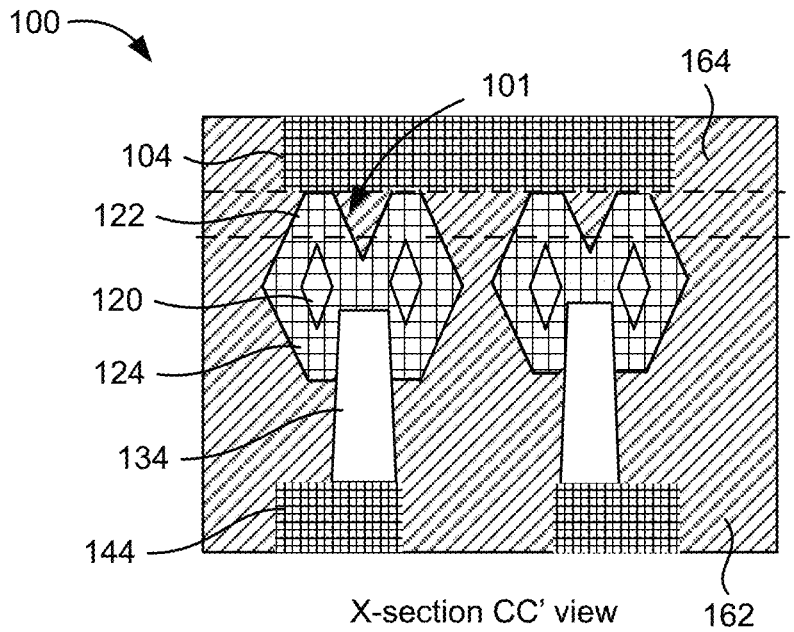
FIG. 1D illustrates a partial cross-sectional view of the apparatus of FIG. 1A in accordance with one or more aspects of the disclosure.

FIG. 1D illustrates a partial cross-sectional view of the apparatus 100 of FIG. 1A in accordance with one or more aspects of the disclosure. Specifically, the cross-sectional view is illustrated along the CC' line of FIG. TA. The apparatus 100 includes a transistor 101 that has a drain 110, where the source 120 is substantially enclosed in a source silicide layer 124. An integral source via portion 122 of the source silicide layer 124 is coupled to a second source contact 104 (which is part of a backside metallization structure discussed in further detail below). A first source via 134 couples the source silicide layer 124 to a first source contact 144 (which is part of a frontside metallization structure discussed in further detail below). In some aspects, the integral source via portion 122 is embedded in the source silicide 124 and the source 120 (e.g., the integral source via portion 122 is formed as part of the source layer). In some aspects, the integral source via portion 122 is an extended portion of the source silicide 124 and the source 120 (e.g., the integral source via portion 122 is formed as an additional portion to the source layer). The frontside dielectric 162 is disposed on the frontside of transistor 101 and the backside dielectric 164 is disposed on an opposite side of the transistor 101, however, in some portions the frontside dielectric 162 and the backside dielectric 164 may form a generally homogeneous dielectric portion enclosing the transistor 101 and other transistors of the apparatus 100.

In some aspects, the drain 110 and the source 120 may be formed from one of Silicon or Carbon doped Silicon, e.g., for nFETs, or Silicon Germanium (SiGE), e.g., for pFETs. In some aspects, the second source contact 104, second drain contact 102, first drain contact 142, and first source contact 144 are formed from one or more of tungsten (W), copper (Cu), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), and ruthenium (Ru) or any highly conductive material. In some aspects, the first drain via 132 and first source via 134 are formed of tungsten (W) or any highly conductive material.

Figure 2A:
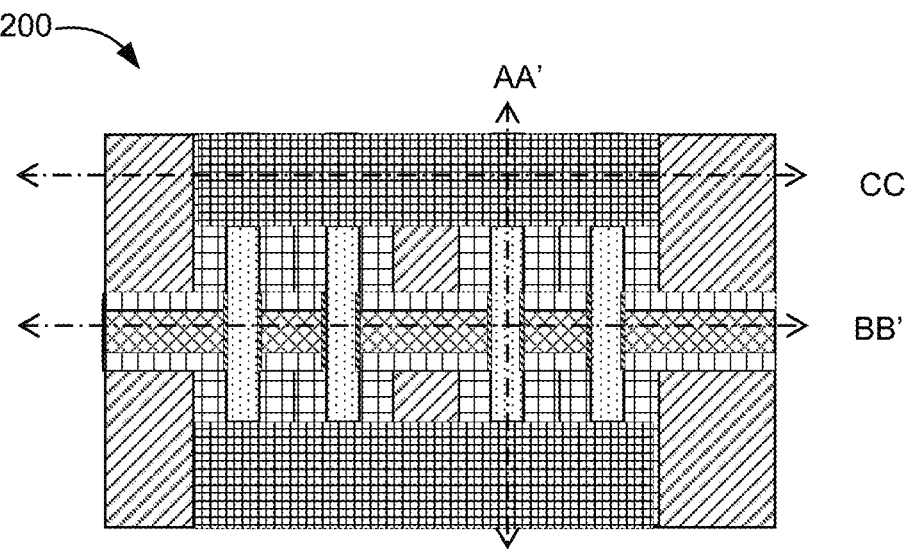
FIG. 2A illustrates a partial top down view of an apparatus in accordance with one or more aspects of the disclosure.

FIG. 2A illustrates a partial top down view of an apparatus 200 in accordance with one or more aspects of the disclosure. The top down view of is a view of the wafer post flip. The apparatus, in some aspects, may be or include one or more three-dimensional integrated circuit (3DIC) devices, including Gate-All-Around (GAA) devices. The top down view illustrates a plurality of transistors in a cell configuration, with cross-sectional lines AA', BB' and CC', which will be detailed in the following description.

Figure 2B:
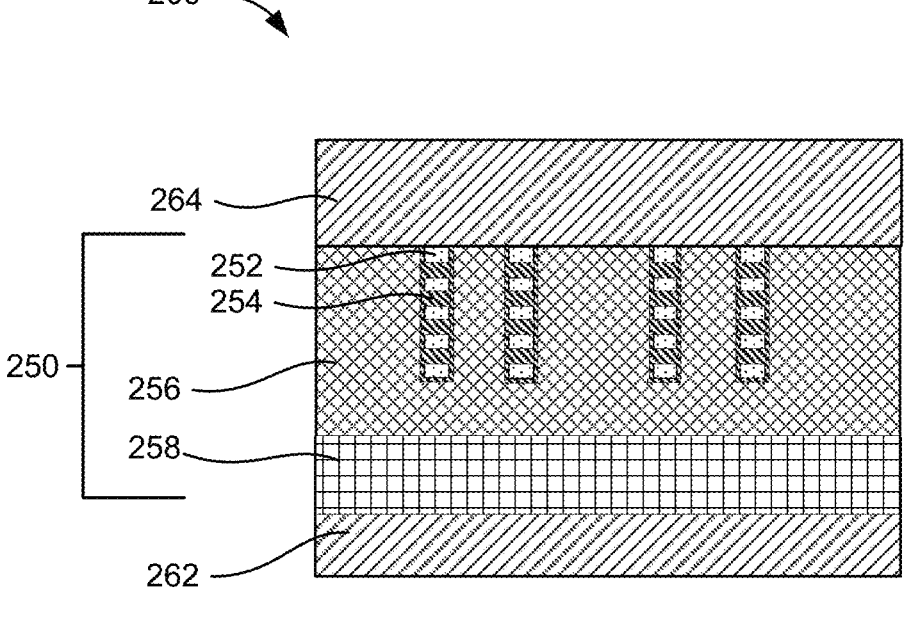
FIG. 2B illustrates a partial cross-sectional view of the apparatus of FIG. 2A in accordance with one or more aspects of the disclosure.

FIG. 2B illustrates a partial cross-sectional view of the apparatus 200 of FIG. 2A in accordance with one or more aspects of the disclosure. Specifically, the cross-sectional view is illustrated along the BB' line of FIG. 2A, which includes a plurality of gate structures 250. A gate poly 256 may be a heavily doped Polysilicon (Poly) and includes a plurality of gate stack portions 252, which in some aspects are a lightly doped Si and are surrounded by a gate oxide 254, which in some aspects is Silicon Dioxide (SiO$_2$). A gate contact layer 258, which in some aspects is silicide, is disposed on the gate poly 256. A frontside dielectric 262 is disposed on the plurality of gate structures 250 and backside dielectric 264 is disposed on an opposite side of the plurality of gate structures 250.

Figure 2C:
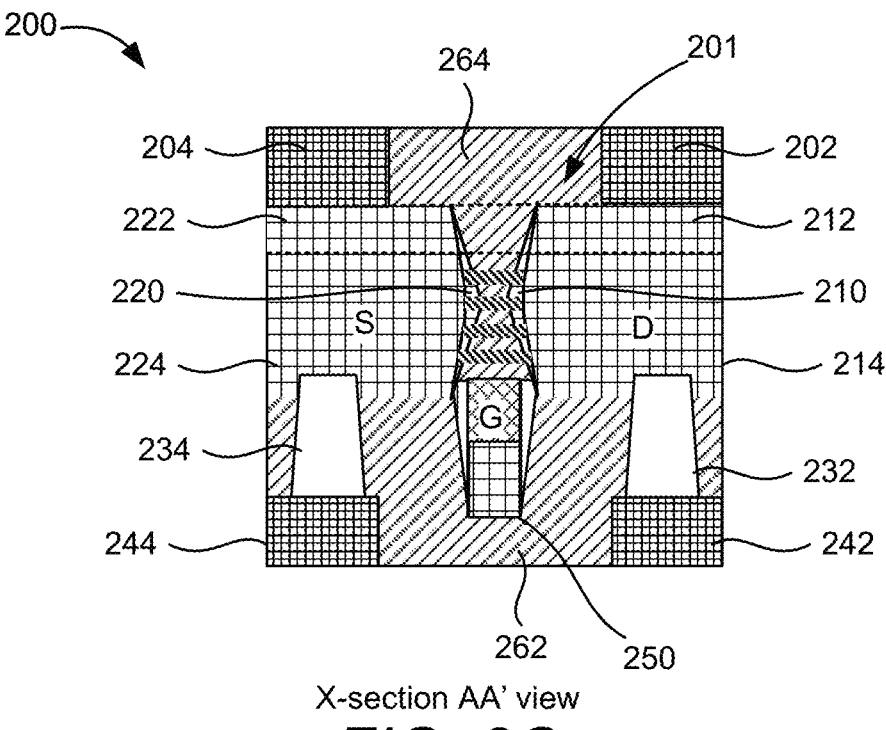
FIG. 2C illustrates a partial cross-sectional view of the apparatus of FIG. 2A in accordance with one or more aspects of the disclosure.

FIG. 2C illustrates a partial cross-sectional view of the apparatus 200 of FIG. 2A in accordance with one or more aspects of the disclosure. Specifically, the cross-sectional view is illustrated along the AA' line of FIG. 2A. The apparatus 200 includes a transistor 201 that has a drain 210 substantially enclosed in a drain silicide layer 214. An integral drain via portion 212 of the drain silicide layer 214 is coupled to a second drain contact 202 (which is part of a backside metallization structure discussed in further detail below). A first drain via 232 couples the drain silicide layer 214 to a first drain contact 242 (which is part of a frontside metallization structure discussed in further detail below). A source 220 is substantially enclosed in a source silicide layer 224. An integral source via portion 222 of the source silicide layer 224 is coupled to a second source contact 204 (which is part of a backside metallization structure discussed in further detail below). A first source via 234 couples the source silicide layer 224 to a first source contact 244 (which is part of a frontside metallization structure discussed in further detail below). A gate structure 250 is disposed between the source 220 and the drain 210. The frontside dielectric 262 is disposed on the frontside of transistor 201 and the backside dielectric 264 is disposed on an opposite side of the transistor 201. In some aspects, the integral source via portion 222 is in direct contact with the second source contact 204 and the integral drain via portion 212 is in direct contact with the second drain contact 202. In some aspects, the drain silicide layer 214 and source silicide layer 224 each have a substantially uniform thickness. In some aspects, the drain silicide layer 214 and source silicide layer 224 have substantially a same thickness. In some aspects, the integral drain via portion 212 is embedded in the drain silicide 214 and the drain 210. In some aspects, the integral drain via portion 212 is an extended portion of the drain silicide 214 and the drain 210.

Figure 2D:
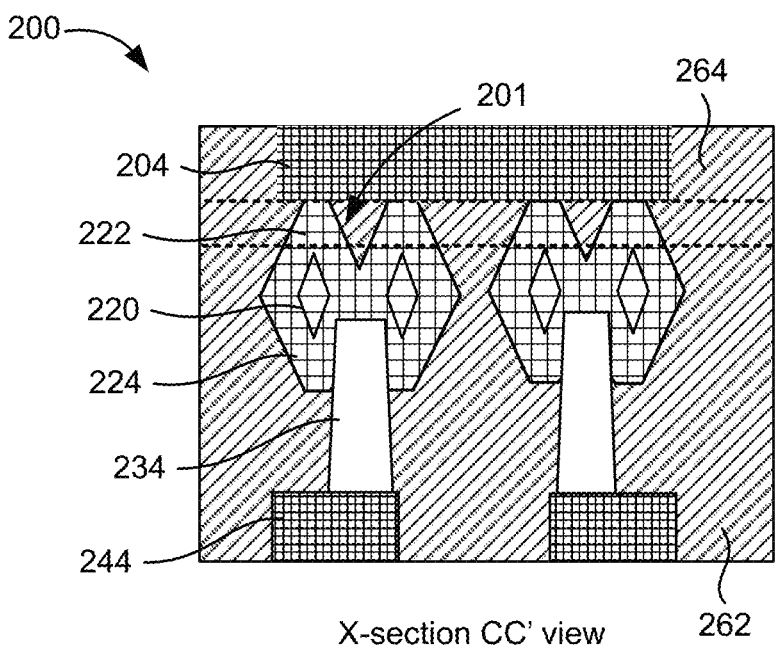
FIG. 2D illustrates a partial cross-sectional view of the apparatus of FIG. 2A in accordance with one or more aspects of the disclosure.

FIG. 2D illustrates a partial cross-sectional view of the apparatus 200 of FIG. 2A in accordance with one or more aspects of the disclosure. Specifically, the cross-sectional view is illustrated along the CC' line of FIG. 2A. The apparatus 200 includes a transistor 201 where the source 220 is substantially enclosed in a source silicide layer 224. An integral source via portion 222 of the source silicide layer 224 is coupled to a second source contact 204 (which is part of a backside metallization structure discussed in further detail below). A first source via 234 couples the source silicide layer 224 to a first source contact 244 (which is part of a frontside metallization structure discussed in further detail below). In some aspects, the integral source via portion 222 is embedded in the source silicide 224 and the source 220. In some aspects, the integral source via portion 222 is an extended portion of the source silicide 224 and the source 220. The frontside dielectric 262 is disposed on the frontside of transistor 201 and the backside dielectric 264 is disposed on an opposite side of the transistor 201. The frontside dielectric 262 is disposed on the frontside of transistor 201 and the backside dielectric 264 is disposed on an opposite side of the transistor 201, however, in some portions the frontside dielectric 262 and the backside dielectric 264 may form a generally homogeneous dielectric portion enclosing the transistor 201 and other transistors of the apparatus 200.

In some aspects, the drain 210 and the source 220 may be formed from one of Carbon doped Silicon, e.g., for nFETs, or Silicon Germanium (SiGE), e.g., for pFETs. In some aspects, the second source contact 204, second drain contact 202, first drain contact 242, and first source contact 244 are formed from one or more of tungsten (W), copper (Cu), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), and ruthenium (Ru) or any highly conductive material. In some aspects, the first drain via 232 and first source via 234 are formed of tungsten (W) or any highly conductive material.

Figure 3:
FIG. 3 illustrates a partial cross-sectional view of an apparatus in accordance with one or more aspects of the disclosure.

FIG. 3 illustrates a partial cross-sectional view of an apparatus 300 in accordance with one or more aspects of the disclosure. The apparatus 300 includes a transistor 301, similar to the transistors (e.g., 101, 201) discussed in the foregoing. Accordingly, details of all the transistor 301 structure will not be specifically labeled or provided. As discussed in relation to the prior transistors, the transistor 301 has a drain 310 substantially enclosed in a drain silicide layer 314 and a source 320 is substantially enclosed in a source silicide layer 324. An integral drain via portion 312 of the drain silicide layer 314 is coupled to a second drain contact 302 which is part of a backside metallization 370 structure, specifically, metal layer 370-0 (BM0). An integral source via portion 322 of the source silicide layer 324 is coupled to a second source contact 304 which is also part of the backside metallization 370 structure, specifically, metal layer 370-0 (BM0). A first drain via 332 couples the drain silicide layer 314 to a first drain contact 342, which is part of a frontside metallization structure 360, specifically, metal layer 360-0 (M0). A first source via 334 couples the source silicide layer 324 to a first source contact 344 which is also part of the frontside metallization structure 360, specifically, metal layer 360-0 (M0). Frontside metal layers 360-0, 360-1, 360-2, 360-n are formed in the frontside dielectric 362. The frontside dielectric 362 provides insulation for the frontside metallization structure 360. Backside metal layers

370-0, 370-1, 370-2, 370-_m_ are formed in the frontside dielectric 372. The backside dielectric 372 provides insulation for the backside metallization structure 370.

It will be appreciated that a reduction in the IC thickness can be achieved by directly coupling the integral drain via portion 312 to the second drain contact 302, and the integral source via portion 322 to the second source contact 304, which both are part of the backside metallization 370 structure. Additionally, the connectivity of local devices and 3DIC performances can be improved. For example, multiple ICs can be stacked to provide a increased functionality and a smaller form factor. In some aspects, the integral drain via portion 312 and/or the integral source via portion 322 may be coupled direct to a buried power rail (BPR). In this configuration, limitations of conventional microscopic thru-silicon-vias (mTSV) coupling are eliminated. Further, the integral drain via portion 312 and integral source via portion 322 allow for back side interconnections and can be directly used to connect power rails similar to BPR. However, unlike BPR, the integral drain via portions 312/integral source via portions 322 do not need any additional area outside of the active device, which provides more flexibility for the connections and are not limited to power or ground nets.

FIGS. 4A-4H illustrate examples of stages of fabricating an integrated circuit structure in accordance with one or more aspects of the disclosure. In this instance, the stages may apply to the fabrication of an apparatus 400 similar to the foregoing apparatuses 100, 200 and 300.

Figure 4A:
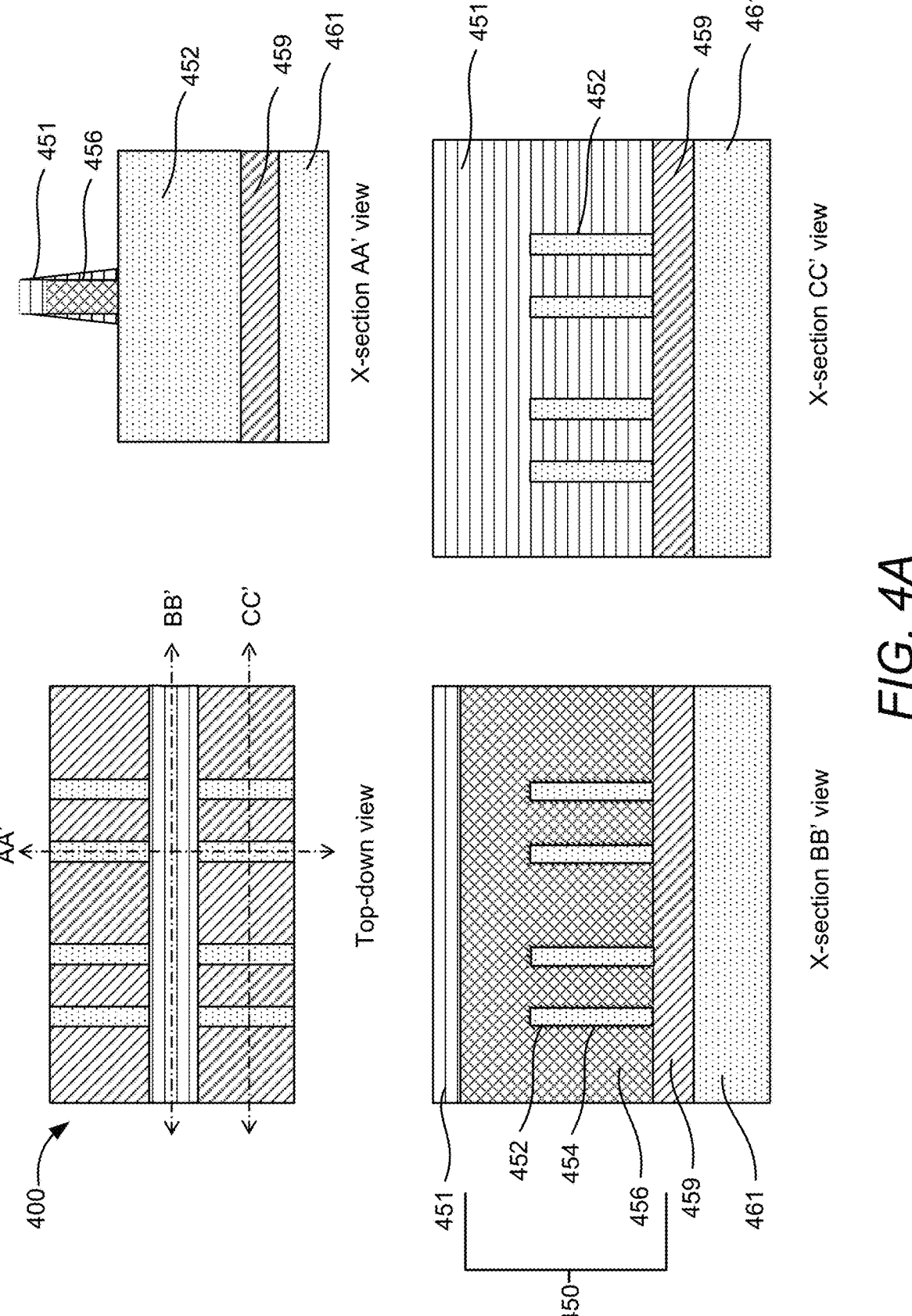
FIGS. 4A-4H illustrate examples of stages of fabricating an integrated circuit structure in accordance with one or more aspects of the disclosure.

FIG. 4A illustrates a portion of a fabrication process of an apparatus 400 in accordance with one or more aspects of the disclosure. In the illustration, a plan view and three cross-sectional views are provided. The cross-sectional views are along the AA', BB' and CC' lines of the plan view, which is a top down view. At this stage of the fabrication process, the gate channels 452 and the gate spacer 451 are formed. Specifically, the cross-sectional view is illustrated along the BB' line and includes a plurality of gate structures 450. A gate poly 256 may be a heavily doped Polysilicon (Poly) and includes a plurality of gate channels 452, which in some aspects are a lightly doped Si and are surrounded by a gate oxide 454, which in some aspects is Silicon Dioxide ($SiO_2$). A buried oxide layer 459, which in some aspects is $SiO_2$, is disposed on a substrate 461, which in some aspects is a lightly doped Si. The cross-sectional view illustrated along the AA' line and the cross-sectional view illustrated along the CC' line (along the source/drain (S/D) region) each includes similar elements viewed from the illustrated perspective.

Figure 4B:
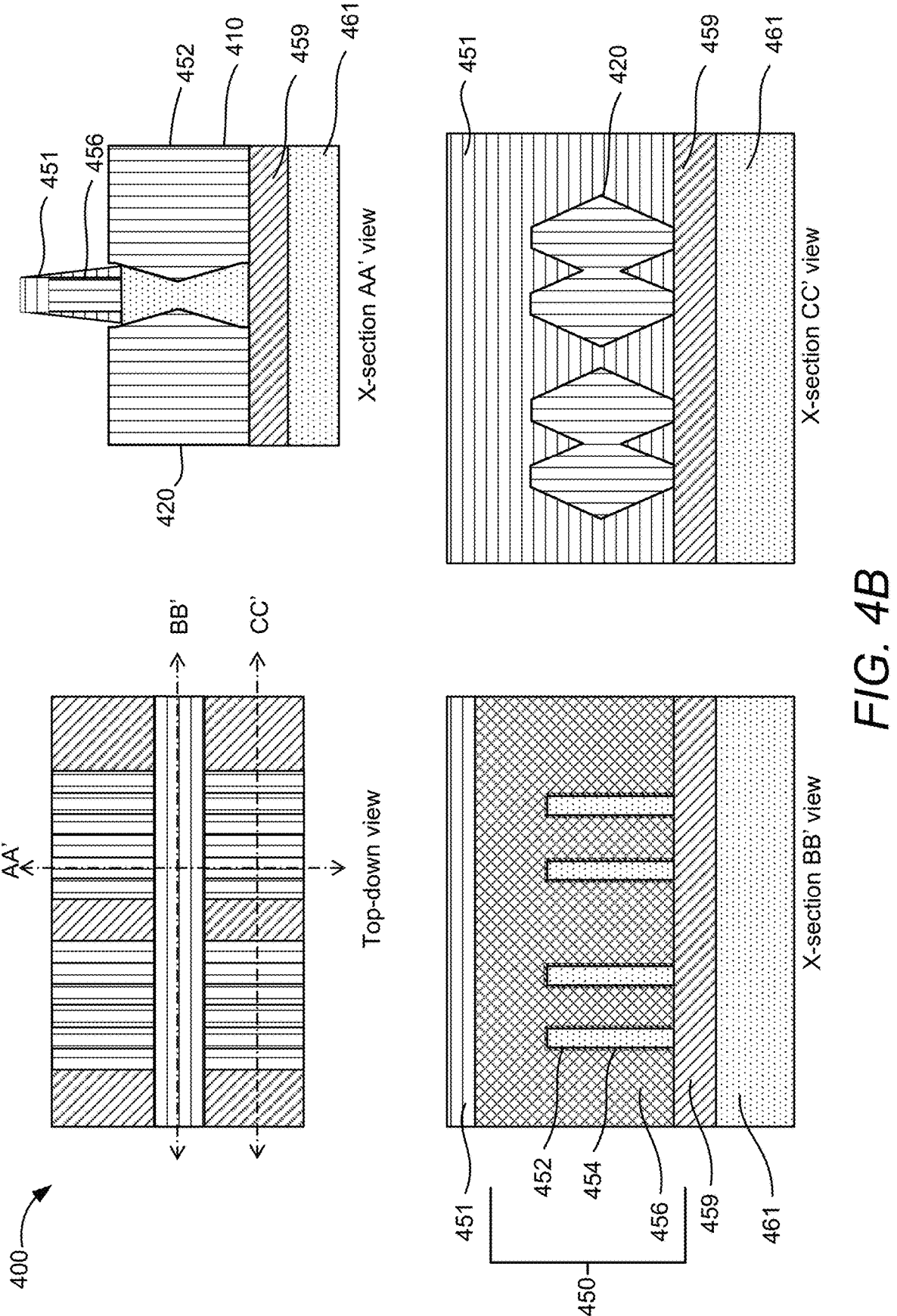

FIG. 4B illustrates a portion of a fabrication process of the apparatus 400 in accordance with one or more aspects of the disclosure. In the illustration, a plan view and three cross-sectional views are provided. The cross-sectional views are along the AA', BB' and CC' of the plan view, which is a top down view. At this stage of the fabrication process, the sources/drains are formed. The source 420/drain 410 (S/D) may be formed by epitaxial (epi) techniques that are commonly employed. Epitaxy involves the growth of a crystalline material (e.g., using Carbon doped Silicon or SiGe) on the surface of the gate channels 452, to reduce parasitic series resistance. The cross-sectional view illustrated along the AA' line includes a source 420 and a drain 410 with a gate structure 450, including the gate channel 452, gate poly 456 and gate channel 452. The buried oxide layer 459 between the substrate 461, The cross-sectional view illustrated along the CC' line (along the source/drain region, as each will have a similar structure) each source 420 (and drain), in some aspects has a generally diamond shape in this perspective view. The cross-sectional view illustrated along the BB' line (channel portion) includes a plurality of gate structures 450, which includes a gate poly 456, including a plurality of gate channels 452, a gate oxide 454, which in some aspects is $SiO_2$. The cross-sectional view illustrated along the BB' line is unchanged from FIG. 4A, so a detailed rendition of all the elements will not be presented.

Figure 4C:
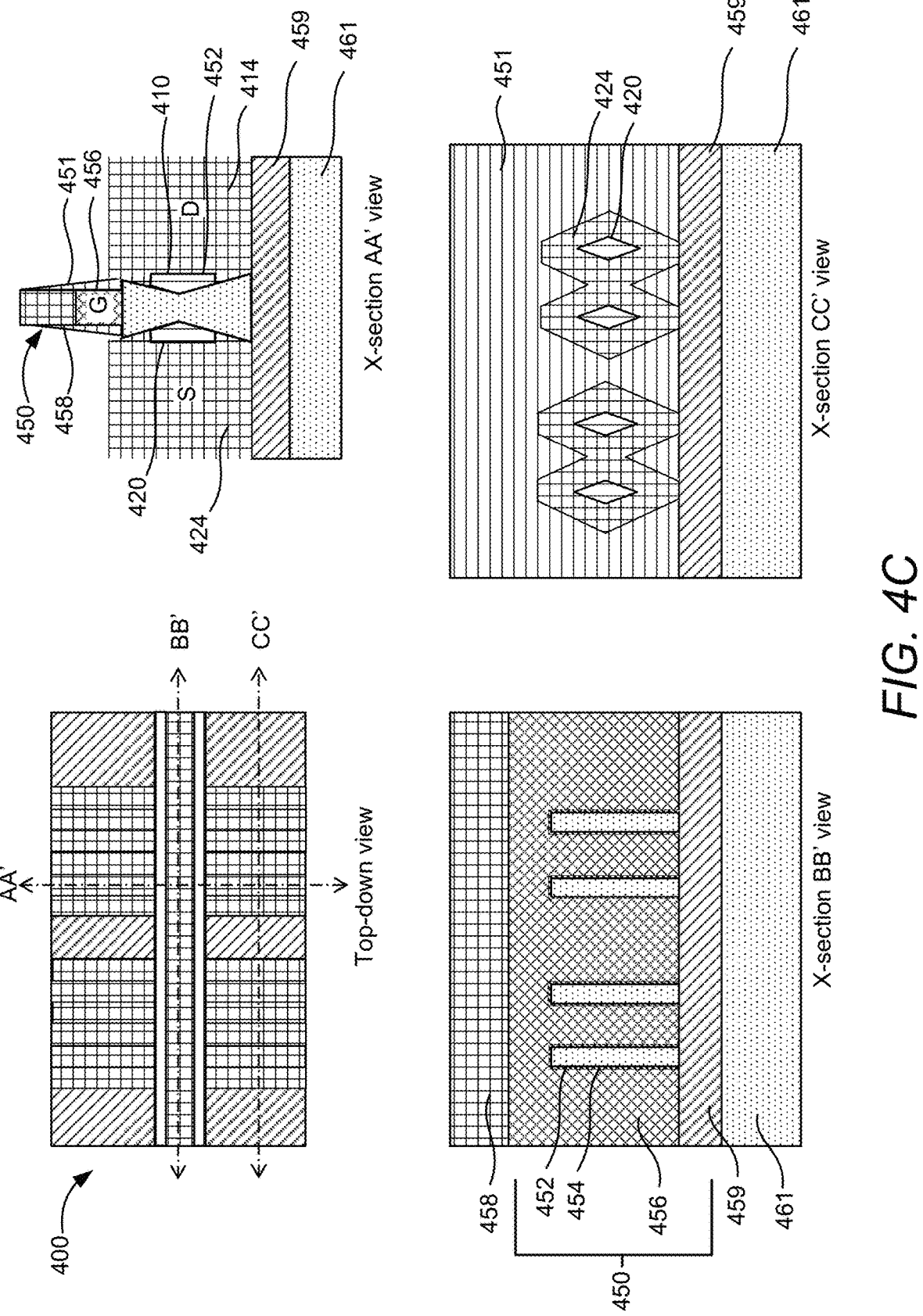

FIG. 4C illustrates a portion of a fabrication process of the apparatus 400 in accordance with one or more aspects of the disclosure. In the illustration, a plan view and three cross-sectional views are provided. The cross-sectional views are along the AA', BB' and CC' lines of the plan view, which is a top down view. At this stage of the fabrication process, silicide is disposed over the source/drain portions. The cross-sectional view illustrated along the AA' line includes the source 420 substantially enclosed by source silicide layer 424 and the drain 410 substantially enclosed by drain silicide layer 414. The gate structure 450 also has a portion of the gate poly 456 removed and replaced by gate contact layer 458 opposite the gate channel 452. The buried oxide layer 459 is disposed between silicide layers 414 and 424 the substrate 461, The cross-sectional view illustrated along the CC' line (along the source region) includes a plurality of source structures, each source 420, in some aspects has a diamond shape in this perspective view and is enclosed by enclosed by source silicide layer 424. The silicide layers 414 and 424 may also have a diamond shape, as in some aspects the silicide layers 414 and 424 have a uniform thickness and may also have the same thickness. The cross-sectional view illustrated along the BB' line (channel portion) includes a plurality of gate structures 450, which includes a gate poly 456, including a plurality of gate channels 452, a gate oxide 454. The cross-sectional view illustrated along the BB' line is unchanged from FIG. 4A, except for the silicide forming the gate contact layer 458, so a detailed rendition of all the elements will not be presented.

Figure 4D:
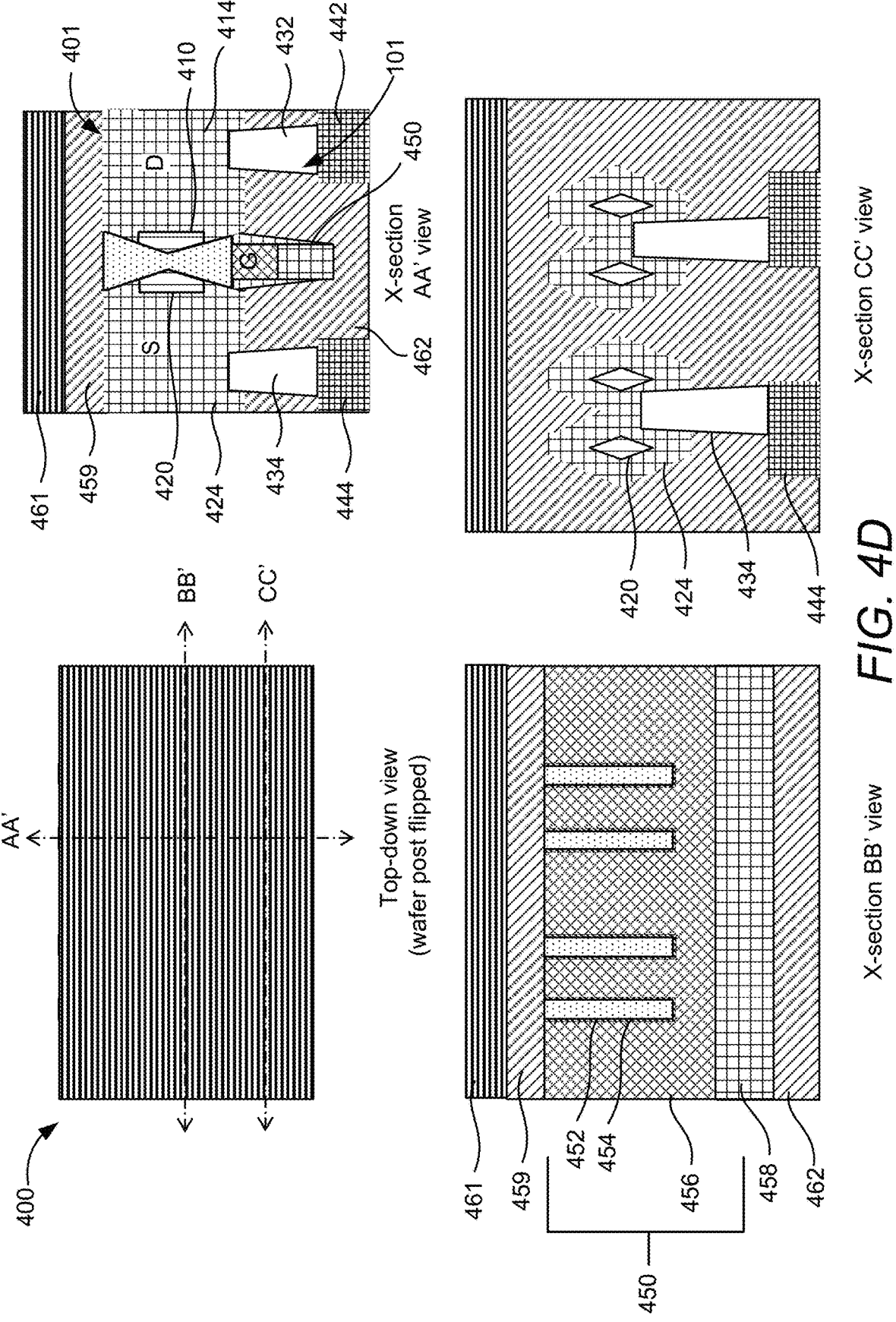

FIG. 4D illustrates a portion of a fabrication process of the apparatus 400 in accordance with one or more aspects of the disclosure. In the illustration, a plan view and three cross-sectional views are provided. The cross-sectional views are along the AA', BB' and CC' of the plan view, which is a flipped top down view. At this stage of the fabrication process, one or more frontside metal layers may be formed, including the first drain contact 442, first drain via 432, first source via 434 and first source contact 444. This may be accomplished through standard CMOS front-end-of-line (FEOL), middle-of-line (MOL), and back-end-of-line (BEOL) processes. Additionally, after the BEOL processing the wafer is flipped so the top view is from the flipped perspective. The cross-sectional view illustrated along the AA' line includes the source 420 substantially enclosed by source silicide layer 424, which is coupled to the first source via 434 and first source contact 444. The drain 410 is substantially enclosed by drain silicide layer 414, which is coupled to the first drain via 432 and first drain contact 442. The frontside dielectric 462 is disposed on the frontside of transistor 401. The cross-sectional view illustrated along the CC' line (along the source region) includes a plurality of source structures, each source 420, in some aspects has a diamond shape in this perspective view and is enclosed by enclosed by source silicide layer 424 which is coupled to the first source via 434 and first source contact 444. The cross-sectional view illustrated along the BB' line (channel portion) includes a plurality of gate structures 450, which includes a gate poly 456, and each including a gate channel 452, a gate oxide 454. the gate contact layer 458 is disposed between the gate poly 456 and frontside dielectric 462. Since the wafer has been flipped the substrate 461 and buried oxide layer 459 are now illustrated on the top.

Figure 4E:
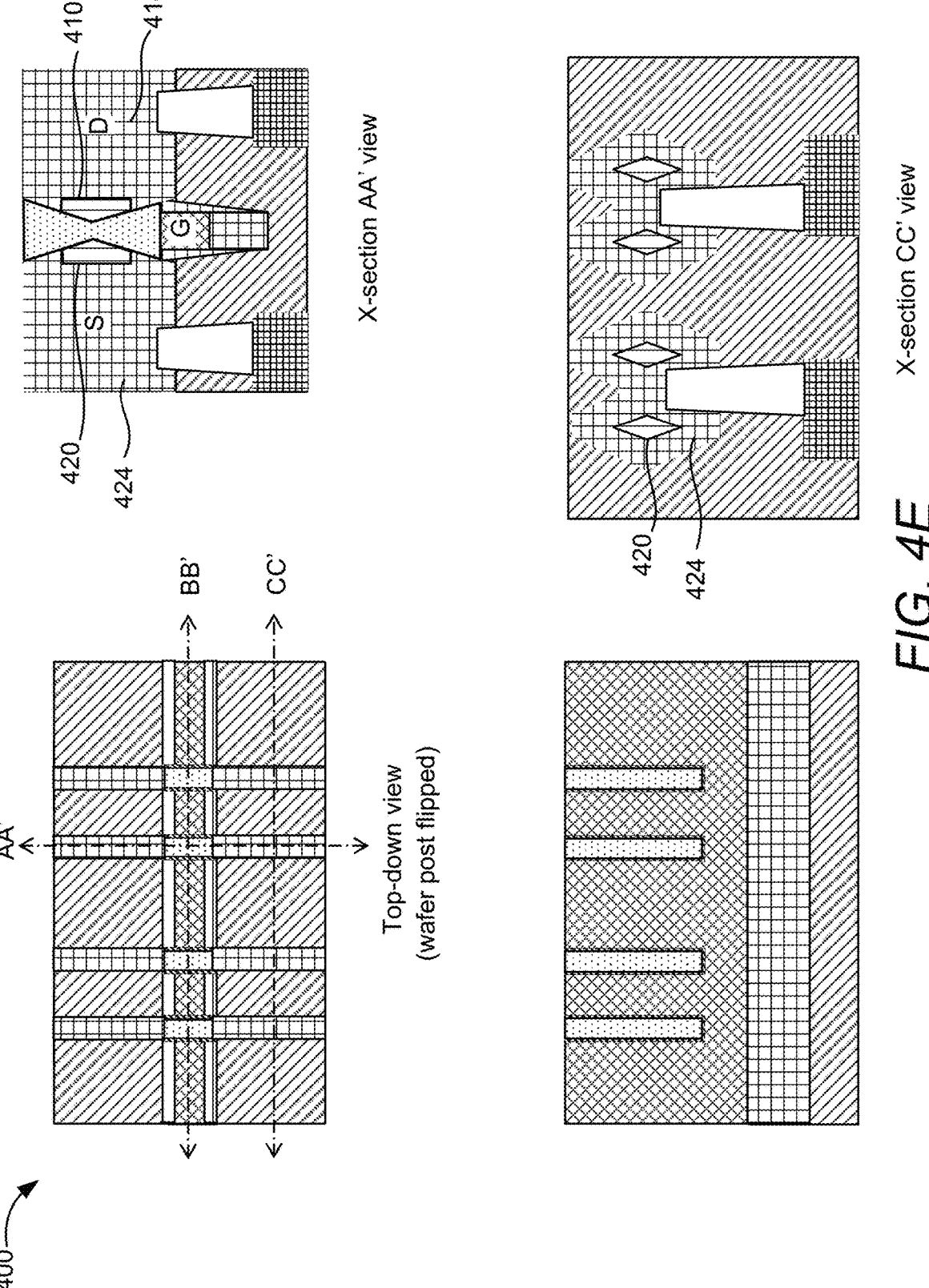

FIG. 4E illustrates a portion of a fabrication process of the apparatus 400 in accordance with one or more aspects of the disclosure. In the illustration, a plan view and three cross-sectional views are provided. The cross-sectional views are along the AA', BB' and CC' lines of the plan view, which is a flipped top down view. At this stage of the fabrication process, the substrate and buried oxide layer are removed which exposes the bottom side of the source 420, source silicide layer 424, drain 410 and drain silicide layer 414 for further processing. Since no other changes were made at this stage, further details of the cross-sectional views along the AA', BB' and CC' lines, will not be provided.

Figure 4F:
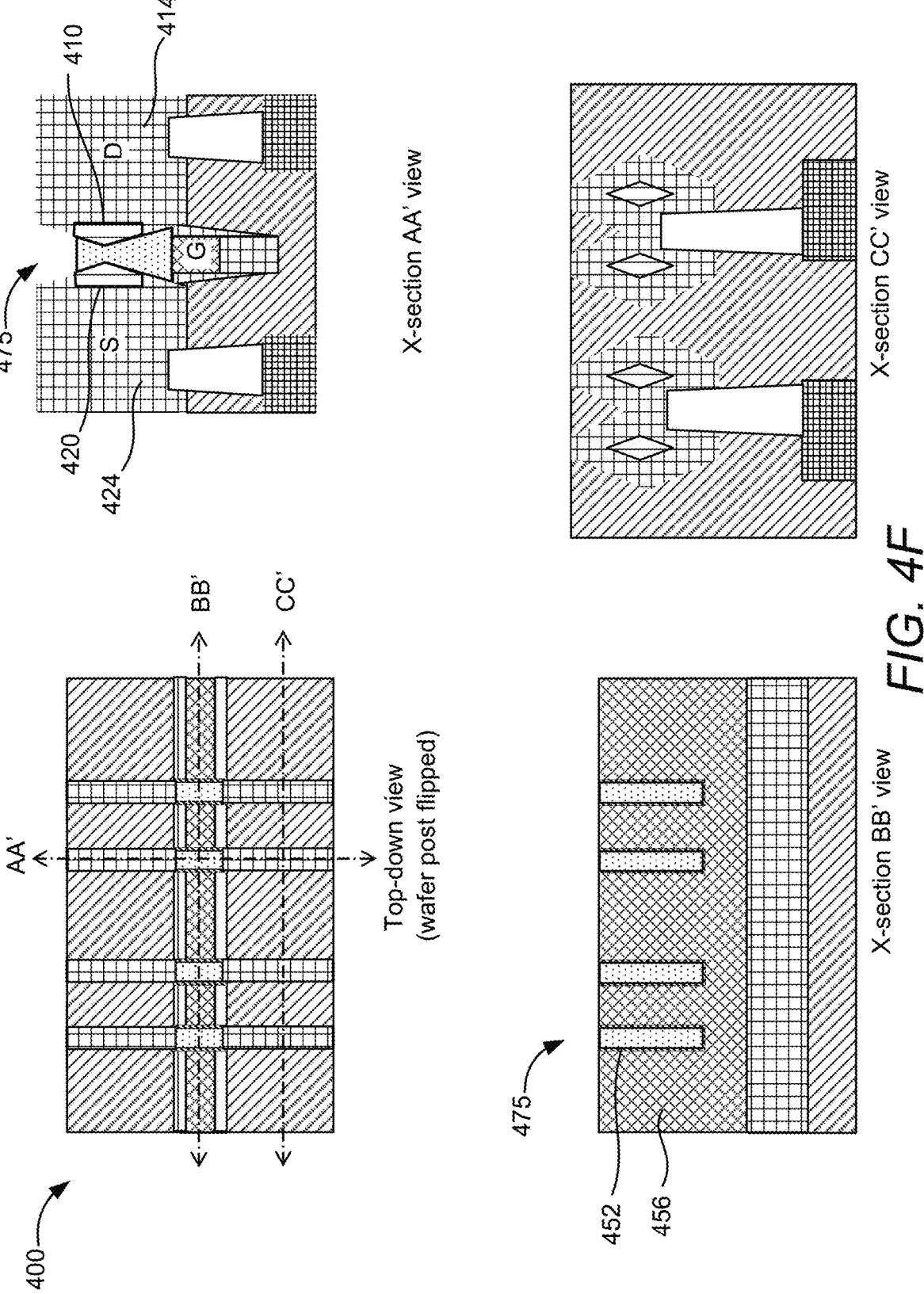

FIG. 4F illustrates a portion of a fabrication process of the apparatus 400 in accordance with one or more aspects of the disclosure. In the illustration, a plan view and three cross-sectional views are provided. The cross-sectional views are along the AA', BB' and CC' lines of the plan view, which is a flipped top down view. At this stage of the fabrication process, the selective etching is used to remove the silicon from a portion of the gate channel 452 and poly (gate poly 456) but retains the silicide. This forms a recess 475 in the channel region, between the source 420, source silicide layer 424, drain 410 and drain silicide layer 414. Since no other changes were made at this stage, further details of the cross-sectional views along the AA', BB' and CC' lines, will not be provided.

Figure 4G:
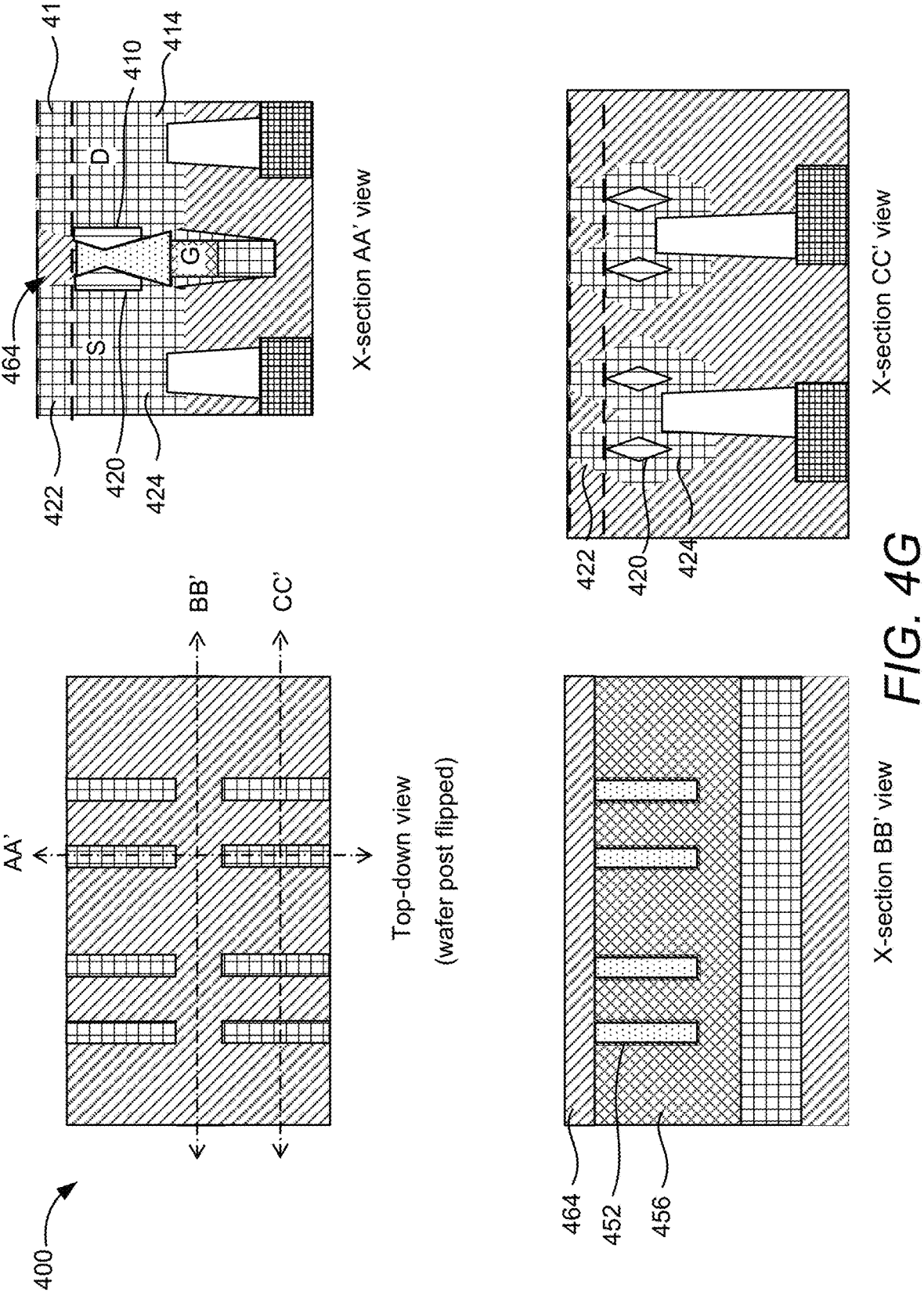

FIG. 4G illustrates a portion of a fabrication process of the apparatus 400 in accordance with one or more aspects of the disclosure. In the illustration, a plan view and three cross-sectional views are provided. The cross-sectional views are along the AA', BB' and CC' lines of the plan view, which is a flipped top down view. At this stage of the fabrication process, a backside dielectric layer is deposited and a chemical mechanical polishing (CMP) is performed to expose the source 420 enclosed in source silicide layer 424 and drain 410 enclosed in drain silicide layer 414. Additionally, the CMP provides for a smooth planar surface on backside dielectric 464, source silicide layer 424 and drain silicide layer 414. In particular, the CMP provides a smooth contact surface for integral source via portion 422 of the source silicide layer 424 and integral drain via portion 412 of the drain silicide layer 414 for further processing. It will be appreciated that in some aspects, the integral drain via portion 412 may be embedded, e.g., formed as part of the drain silicide layer 414 or in other aspects, the integral drain via portion 412 may be extended, e.g., formed as an additional portion/layer of the drain silicide layer 414. Likewise, it will be appreciated that in some aspects, the integral source via portion 422 may be embedded, e.g., formed as part of the source silicide layer 424 or in other aspects, the integral source via portion 422 may be extended, e.g., formed as an additional portion/layer of the source silicide layer 424. Since no other changes were made at this stage, further details of the cross-sectional views along the AA', BB' and CC' lines, will not be provided.

Figure 4H:
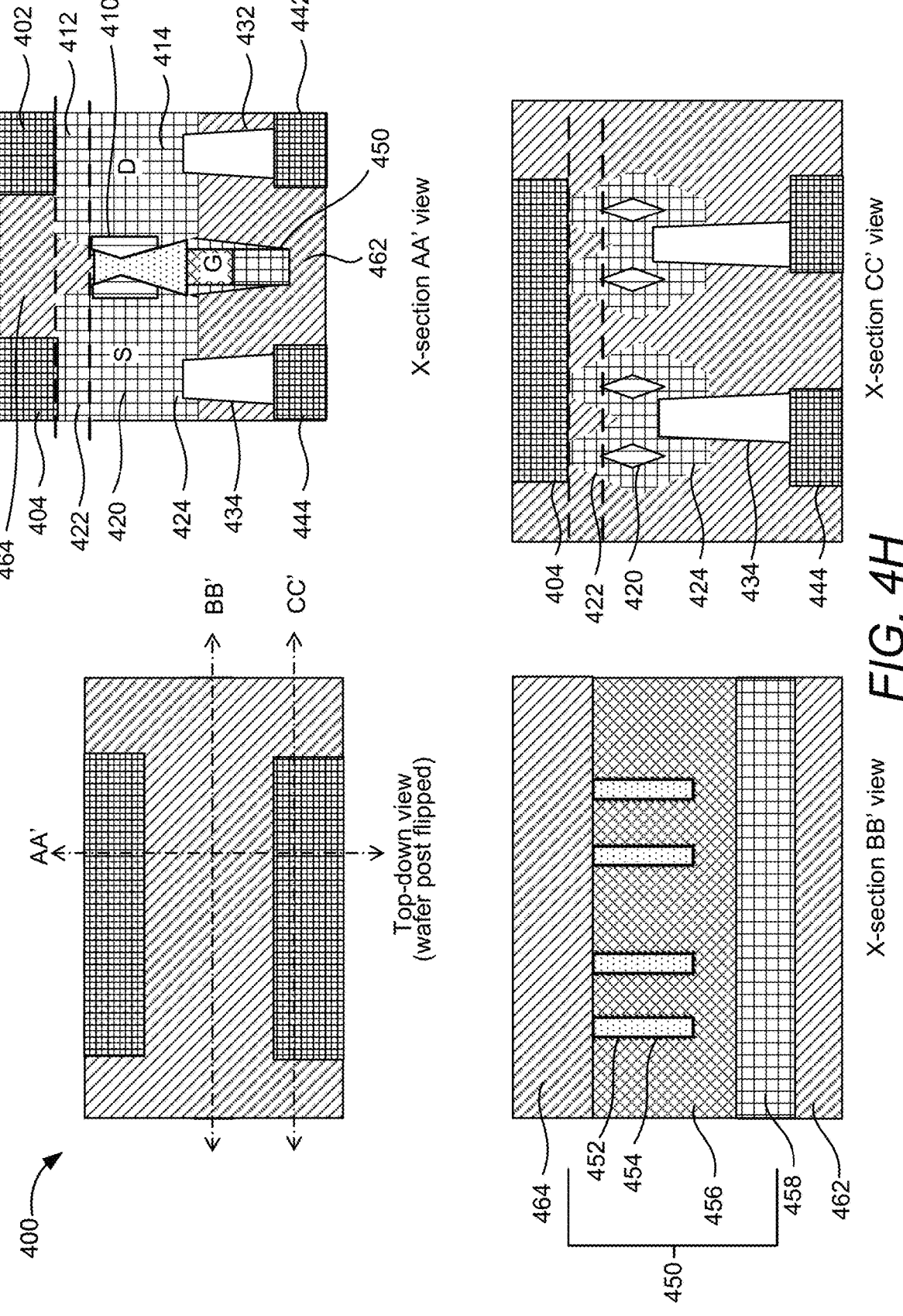

FIG. 4H illustrates a portion of a fabrication process of the apparatus 400 in accordance with one or more aspects of the disclosure. In the illustration, a plan view and three cross-sectional views are provided. The cross-sectional views are along the AA', BB' and CC' lines of the plan view, which is a flipped top down view. At this stage of the fabrication process, BEOL processing is performed on the backside of the apparatus 400. The BEOL processing is used to form a second drain contact 402 directly on the integral drain via portion 412 of the drain silicide layer 414 and a second source contact 404 directly on the integral source via portion 422 of the source silicide layer 424. The integral via portions 412 and 422 allow for improved tolerance for overlapping or underlapping between the integral via portions 412 and 422 and metal routing (e.g., contacts 102 and 104). As part of BEOL processing on the backside, backside dielectric 464 is disposed over the contacts and additional metal layers of the backside (note the additional metal layers are not illustrated). Since no other changes were made at this stage, further details of the cross-sectional views along the AA', BB' and CC' lines, will not be provided, however, the various elements are labeled consistently with the foregoing elements.

Figure 5:
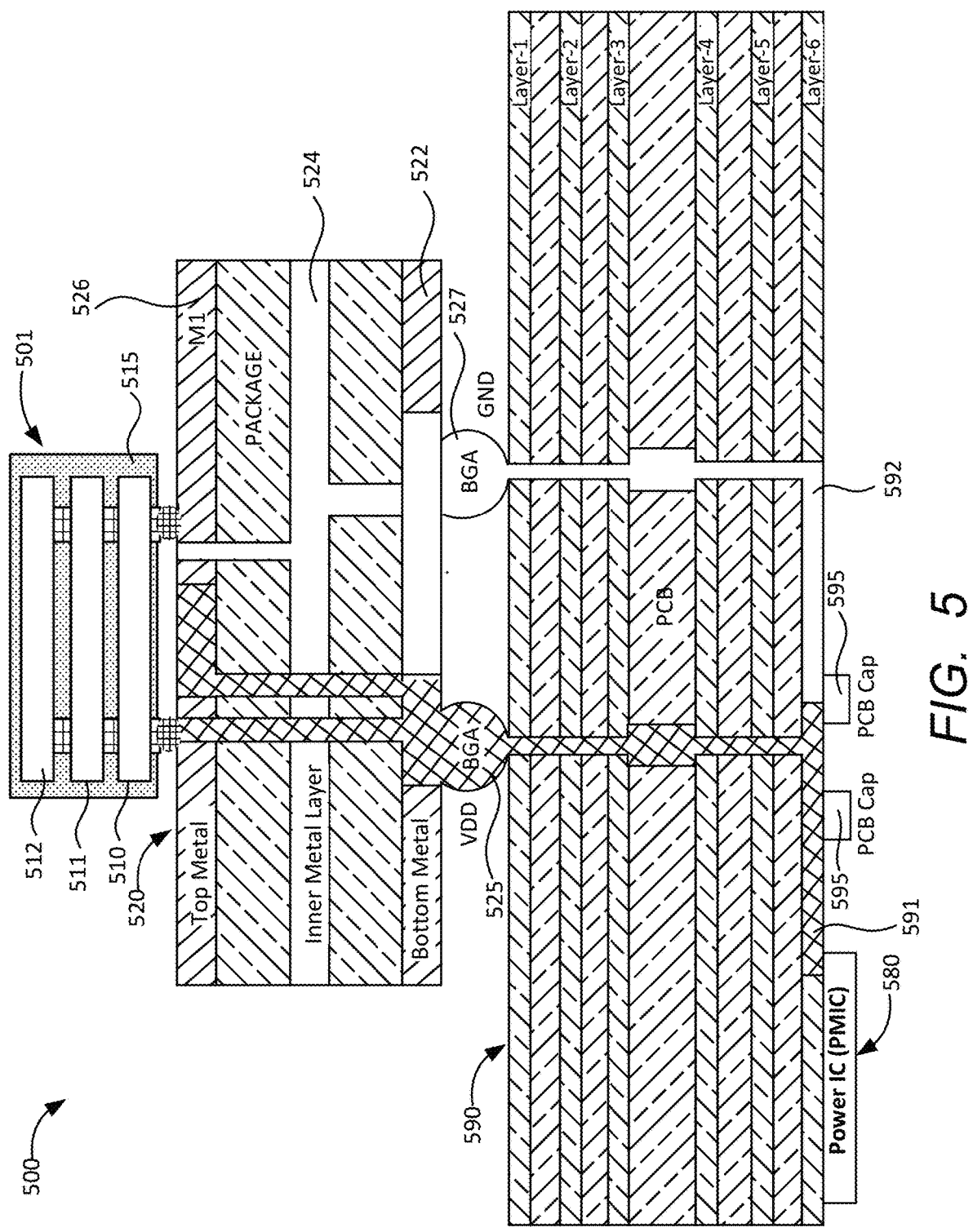
FIG. 5 illustrates components of an integrated device in accordance with one or more aspects of the disclosure.

FIG. 5 illustrates components of an integrated device 500 according to one or more aspects of the disclosure. Regardless of the various configurations of the apparatuses including transistors with double-side contacts discussed above, it will be appreciated that any of these configurations (e.g., 100, 200, 300, 400) can be configured as die 510, die 511 and/or die 512 which may be encapsulated in an encapsulant 515 to form three-dimensional integrated circuit (3DIC) device 501. It will be appreciated that various aspects are not limited to this configuration and more or less dies may provide, with or without encapsulation. The package substrate 520 may be configured to couple the die 510 to a printed circuit board 590 (PCB 590). The PCB 590 is also coupled to a power supply 580 (e.g., a power management integrated circuit (PMIC)), which allows the package substrate 520 and the die 510 to be electrically coupled to the PMIC 580. Specifically, one or more power supply (VDD) lines 591 and one or more ground (GND) lines 592 may be coupled to the PMIC 580 to distribute power to the PCB 590, package substrate 520 via VDD BGA pin 525 and GND BGA pin 527 and to the die 510 coupled to the top metal layer/M1 layer 526 of package substrate 520. The package substrate 520 has a bottom metal layer 522 and may have one or more inner metal layers 524, as is known in the art. It will be appreciated that the various aspects disclosed are not limited to any specific number of metal layers in the package substrate 520. The VDD line 591 and GND line 592 each may be formed from traces, shapes, or patterns in one or more metal layers of the PCB 590 (e.g., layers 1-6) coupled by one or more vias through insulating layers separating the metal layers 1-6 in the PCB 590. The PCB 590 may have one or more PCB capacitors (PCB cap) 595 that can be used to condition the power supply signals, as is known to those skilled in the art. Additional connections and devices may be coupled to and/or pass through the PCB 590 to the package substrate 520 via one or more additional BGA pins (not illustrated) on the package substrate 520. It will be appreciated that the illustrated configuration and descriptions are provided merely to aid in the explanation of the various aspects disclosed herein. For example, the PCB 590 may have more or less metal and insulating layers, there may be multiple lines providing power to the various components, etc. Accordingly, the forgoing illustrative examples and associated figures should not be construed to limit the various aspects disclosed and claimed herein In order to fully illustrate aspects of the design of the present disclosure, methods of fabrication are discussed herein in relation to the various aspects disclosed. Other methods of fabrication are possible, and discussed fabrication methods are presented only to aid understanding of the concepts disclosed herein. It will be appreciated that any of the fabrication processes discussed were provided merely as general illustrations of some of the aspects of the disclosure and are not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

It will be appreciated from the foregoing that there are various methods for fabricating devices disclosed herein. FIG. 6 illustrates a flowchart of a method 600 for fabricating an apparatus (e.g., 100, 200, 300, 400, 500). The method can include forming a drain substantially enclosed in a drain silicide layer, wherein an integral drain via portion of the drain silicide layer is coupled to a second drain contact and wherein a first drain via couples the drain silicide layer to a first drain contact, at block 602. The method further includes forming a source substantially enclosed in a source silicide layer, wherein an integral source via portion of the source silicide layer is coupled to a second source contact and wherein a first source via couples the source silicide layer to a first source contact; a package substrate, at block 604. The method further includes forming a gate disposed between the source and the drain, at block 606. It will be appreciated that the foregoing fabrication method is provided at a high level to highlight the fabrication of general novel aspects of the various aspects disclosed and is not intended to provide for detailed fabrication procedures, which can vary according to the various designs, as is known in the art.

Accordingly, it will be appreciated from the foregoing disclosure that additional processes for fabricating the various aspects disclosed herein will be apparent to those skilled in the art and a literal rendition of the detailed processes related to the processes discussed above will not be provided or illustrated in the included drawings. It will be appreciated that the sequence of the fabrication processes are not necessarily in any order and later processes may be discussed earlier for convenience and to provide an example of the breadth of the various aspects disclosed.

The foregoing disclosed devices and functionalities may be designed and stored in computer files (e.g., register-transfer level (RTL), Geometric Data Stream (GDS) Gerber, and the like) stored on computer-readable media. Some or all such files may be provided to fabrication handlers who fabricate devices based on such files. Resulting products may include various components, including semiconductor wafers that are then cut into semiconductor die and packaged into semiconductor packages, integrated devices, package on package devices, system-on-chip devices, and the like, which may then be employed in the various devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

Figure 7:
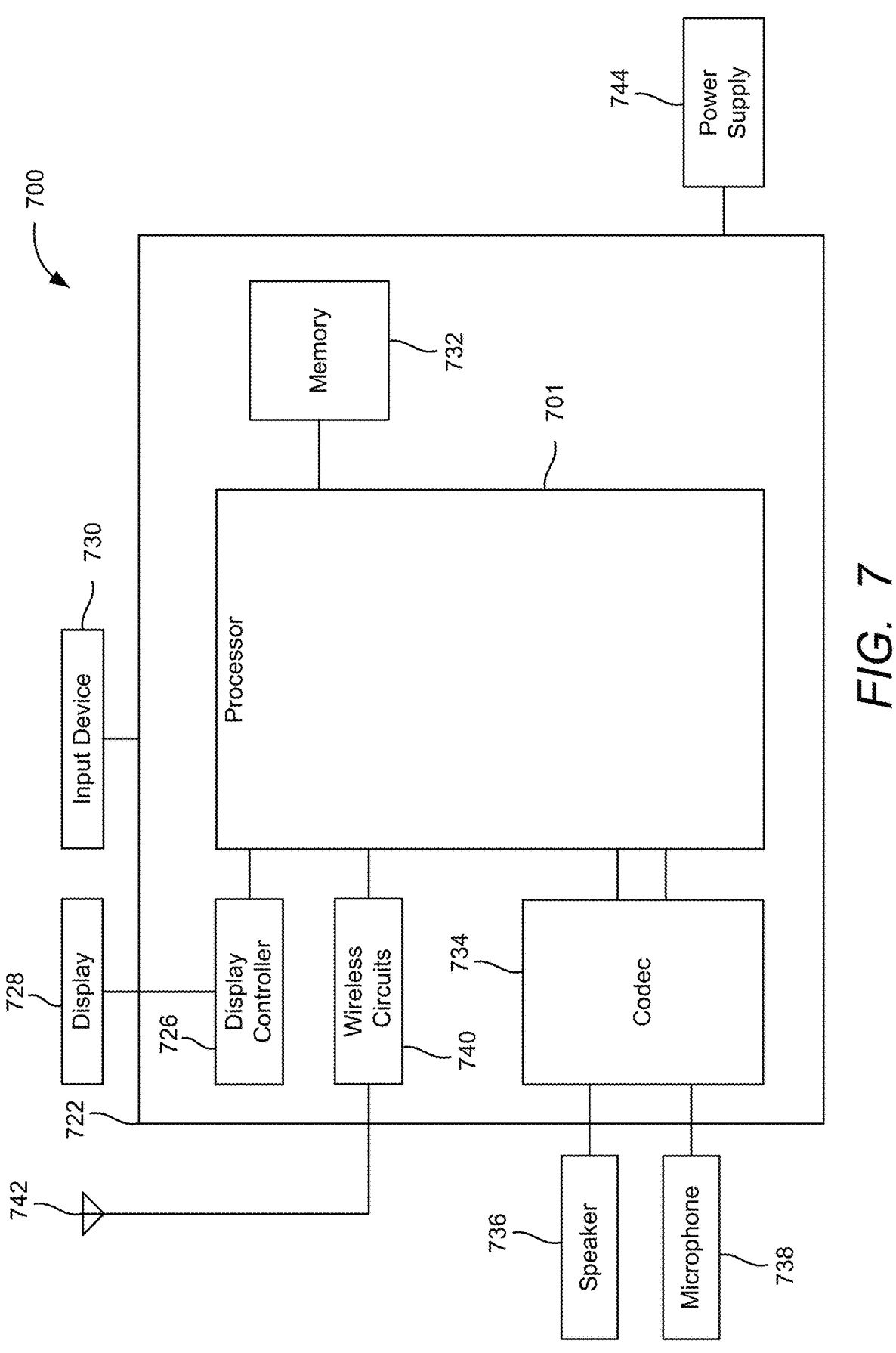
FIG. 7 illustrates an exemplary mobile device in accordance with one or more aspects of the disclosure.

FIG. 7 illustrates an exemplary mobile device in accordance with some examples of the disclosure. Referring now to FIG. 7, a block diagram of a mobile device that is configured according to exemplary aspects is depicted and generally designated mobile device 700. In some aspects, mobile device 700 may be configured as a wireless communication device. As shown, mobile device 700 includes processor 701. Processor 701 may be communicatively coupled to memory 732 over a link, which may be a die-to-die or chip-to-chip link. Mobile device 700 also includes display 728 and display controller 726, with display controller 726 coupled to processor 701 and to display 728.

In some aspects, FIG. 7 may include coder/decoder (CODEC) 734 (e.g., an audio and/or voice CODEC) coupled to processor 701; speaker 736 and microphone 738 coupled to CODEC 734; and wireless circuits 740 coupled to wireless antenna 742 and to processor 701.

In one or more aspects, the processor 701, memory 732, wireless circuits 740, and/or other components of mobile device 700, may be implemented using one or more of the three-dimensional integrated circuit (3DIC) devices including transistor devices with double side contacts and further including double-side contacts in FinFET and Gate-All-Around (GAA) devices, as disclosed herein).

In a particular aspect, where one or more of the above-mentioned blocks are present, processor 701, display controller 726, memory 732, CODEC 734, and wireless circuits 740 can be included in a system-in-package or system-on-chip device 722 which may be implemented in whole or part using the various aspects disclosed herein. Input device 730 (e.g., physical, or virtual keyboard), power supply 744 (e.g., battery), display 728, input device 730, speaker 736, microphone 738, wireless antenna 742, and power supply 744 may be external to system-on-chip device 722 and may be coupled to a component of system-on-chip device 722, such as an interface or a controller.

It should be noted that although FIG. 7 depicts a mobile device 700, processor 701 and memory 732 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 8:
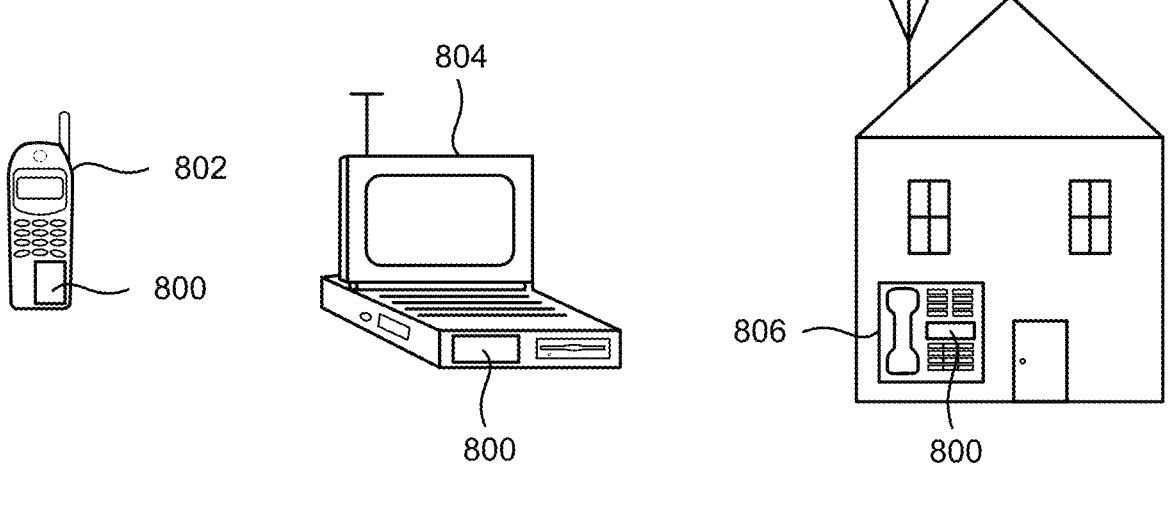
FIG. 8 illustrates various electronic devices that may be integrated with any of the devices disclosed in accordance with one or more aspects of the disclosure.

FIG. 8 illustrates various electronic devices that may be integrated with any of the aforementioned apparatuses/three-dimensional integrated circuit (3DIC) devices, in accordance with various examples of the disclosure. For example, a mobile phone device 802, a laptop computer device 804, and a fixed location terminal device 806 may each be considered generally user equipment (UE) and may include a semiconductor device 800 as described herein. The semiconductor device 800 may be, for example, any of the integrated circuits, dies, integrated devices, integrated device packages, integrated circuit devices, device packages, integrated circuit (IC) packages, single die/multi-die/molded multi-chip devices, etc. described herein. The devices 802, 804, 806 illustrated in FIG. 8 are merely exemplary. Other electronic devices may also feature the semiconductor device 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1A-8 may be rearranged and/or combined into a single component, process, feature, or function or incorporated in several components, processes, or functions. Additional elements, components, processes, and/or functions may also be added without departing from the disclosure. It should also be noted that FIGS. 1A-8 and corresponding description in the present disclosure are not limited to dies and/or ICs. In some implementations, FIGS. 1A-8 and the corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a system in package (SiP), a system on chip (SoC), a package on package (PoP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage, or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, however, these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses.

Clause 1. An apparatus including a transistor comprising: a drain substantially enclosed in a drain silicide layer, wherein an integral drain via portion of the drain silicide layer is coupled to a second drain contact and wherein a first drain via couples the drain silicide layer to a first drain contact; a source substantially enclosed in a source silicide layer, wherein an integral source via portion of the source silicide layer is coupled to a second source contact and wherein a first source via couples the source silicide layer to a first source contact; and a gate disposed between the source and the drain.

Clause 2. The apparatus of clause 1, wherein the integral source via portion is in direct contact with the second source contact and the integral drain via portion is in direct contact with the second drain contact.

Clause 3. The apparatus of any of clauses 1 to 2, wherein the drain silicide layer and the source silicide layer each has a substantially uniform thickness.

Clause 4. The apparatus of clause 3, wherein the drain silicide layer and the source silicide layer have substantially a same thickness.

Clause 5. The apparatus of any of clauses 1 to 4, wherein a thickness of the integral drain via portion and the integral source via portion is approximately 5 nm to 40 nm.

Clause 6. The apparatus of any of clauses 1 to 5, further comprising: a frontside metallization structure having a plurality of frontside metal layers, wherein the first drain contact and the first source contact are formed from one of the plurality of frontside metal layers.

Clause 7. The apparatus of clause 6, further comprising: a backside metallization structure having a plurality of backside metal layers, wherein the second drain contact and the second source contact are formed from one of the plurality of backside metal layers.

Clause 8. The apparatus of clause 7, wherein the integral source via portion is in direct contact with the second source contact formed from a first portion of a first backside metal layer and the integral drain via portion is in direct contact with the second drain contact formed from a second portion of the first backside metal layer.

Clause 9. The apparatus of any of clauses 1 to 8, wherein the transistor is a FinFET or Gate-All-Around (GAA) device.

Clause 10. The apparatus of any of clauses 1 to 9, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

Clause 11. A method for fabricating an apparatus including a transistor, the method comprising: forming a drain substantially enclosed in a drain silicide layer, wherein an integral drain via portion of the drain silicide layer is coupled to a second drain contact and wherein a first drain via couples the drain silicide layer to a first drain contact; forming a source substantially enclosed in a source silicide layer, wherein an integral source via portion of the source silicide layer is coupled to a second source contact and wherein a first source via couples the source silicide layer to a first source contact; and forming a gate disposed between the source and the drain.

Clause 12. The method of clause 11, wherein the integral source via portion is in direct contact with the second source contact and the integral drain via portion is in direct contact with the second drain contact.

Clause 13. The method of any of clauses 11 to 12, wherein the drain silicide layer and the source silicide layer each has a substantially uniform thickness.

Clause 14. The method of clause 13, wherein the drain silicide layer and the source silicide layer have substantially a same thickness.

Clause 15. The method of any of clauses 11 to 14, wherein a thickness of the integral drain via portion and the integral source via portion is approximately 5 nm to 40 nm.

Clause 16. The method of any of clauses 11 to 15, wherein the integral drain via portion is embedded in the drain silicide layer.

Clause 17. The method of any of clauses 11 to 15, wherein the integral drain via portion is an extend portion of the drain silicide layer.

Clause 18. The method of any of clauses 11 to 17, wherein the integral source via portion is embedded in the source silicide layer.

Clause 19. The method of any of clauses 11 to 17, wherein the integral source via portion is an extend portion of the source silicide layer.

Clause 20. The method of any of clauses 11 to 19, further comprising: forming a frontside metallization structure having a plurality of frontside metal layers, wherein the first drain contact and the first source contact are formed from one of the plurality of frontside metal layers.

Clause 21. The method of clause 20, further comprising: forming a backside metallization structure having a plurality of backside metal layers, wherein the second drain contact and the second source contact are formed from one of the plurality of backside metal layers.

Clause 22. The method of clause 21, wherein the integral source via portion is in direct contact with the second source contact formed from a first portion of a first backside metal layer and the integral drain via portion is in direct contact with the second drain contact formed from a second portion of the first backside metal layer.

Clause 23. The method of any of clauses 11 to 22, wherein the transistor is a FinFET or Gate-All-Around (GAA) device.

Clause 24. The method of any of clauses 11 to 23, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An apparatus including a transistor comprising:
a drain enclosed at least on a frontside and a backside in a drain silicide layer, wherein an integral drain via portion of the drain silicide layer is coupled to a second drain contact and wherein a first drain via couples the drain silicide layer to a first drain contact;
a source enclosed at least on a frontside and a backside in a source silicide layer, wherein an integral source via portion of the source silicide layer is coupled to a second source contact and wherein a first source via couples the source silicide layer to a first source contact,
wherein the second drain contact comprises a first portion of a first backside metal layer of a backside metallization structure directly disposed on the integral drain via portion and the second drain contact comprises a second portion of the first backside metal layer disposed on the integral drain via portion; and
a gate disposed between the source and the drain.

2. The apparatus of claim 1, wherein the integral source via portion is in direct contact with the second source contact and the integral drain via portion is in direct contact with the second drain contact.

3. The apparatus of claim 1, wherein the drain silicide layer and the source silicide layer each has a substantially uniform thickness.

4. The apparatus of claim 3, wherein the drain silicide layer and the source silicide layer have substantially a same thickness.

5. The apparatus of claim 1, wherein a thickness of the integral drain via portion and the integral source via portion is approximately 5 nm to 40 nm.

6. The apparatus of claim 1, further comprising:
a frontside metallization structure having a plurality of frontside metal layers, wherein the first drain contact and the first source contact are formed from one of the plurality of frontside metal layers.

7. The apparatus of claim 6, further comprising:
the backside metallization structure having a plurality of backside metal layers, wherein the second drain contact and the second source contact are formed from one of the plurality of backside metal layers.

8. The apparatus of claim 7, wherein the integral source via portion is in direct contact with the second source contact formed from a first portion of a first backside metal layer and the integral drain via portion is in direct contact with the second drain contact formed from a second portion of the first backside metal layer.

9. The apparatus of claim 1, wherein the transistor is a FinFET or Gate-All-Around (GAA) device.

10. The apparatus of claim 1, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

11. A method for fabricating an apparatus including a transistor, the method comprising:
forming a drain enclosed at least on a frontside and a backside in a drain silicide layer, wherein an integral drain via portion of the drain silicide layer is coupled to a second drain contact and wherein a first drain via couples the drain silicide layer to a first drain contact;
forming a source enclosed at least on a frontside and a backside in a source silicide layer, wherein an integral source via portion of the source silicide layer is coupled to a second source contact and wherein a first source via couples the source silicide layer to a first source contact,
wherein the second drain contact comprises a first portion of a first backside metal layer of a backside metallization structure directly disposed on the integral drain via portion and the second drain contact comprises a second portion of the first backside metal layer disposed on the integral drain via portion; and
forming a gate disposed between the source and the drain.

12. The method of claim 11, wherein the integral source via portion is in direct contact with the second source contact and the integral drain via portion is in direct contact with the second drain contact.

13. The method of claim 11, wherein the drain silicide layer and the source silicide layer each has a substantially uniform thickness.

14. The method of claim 13, wherein the drain silicide layer and the source silicide layer have substantially a same thickness.

15. The method of claim 11, wherein a thickness of the integral drain via portion and the integral source via portion is approximately 5 nm to 40 nm.

16. The method of claim 11, wherein the integral drain via portion is embedded in the drain silicide layer.

17. The method of claim 11, wherein the integral drain via portion is an extend portion of the drain silicide layer.

18. The method of claim 11, wherein the integral source via portion is embedded in the source silicide layer.

19. The method of claim 11, wherein the integral source via portion is an extend portion of the source silicide layer.

20. The method of claim 11, further comprising:

forming a frontside metallization structure having a plurality of frontside metal layers, wherein the first drain contact and the first source contact are formed from one of the plurality of frontside metal layers.

21. The method of claim 20, further comprising:

forming the backside metallization structure having a plurality of backside metal layers, wherein the second drain contact and the second source contact are formed from one of the plurality of backside metal layers.

22. The method of claim 21, wherein the integral source via portion is in direct contact with the second source contact formed from a first portion of a first backside metal layer and the integral drain via portion is in direct contact with the second drain contact formed from a second portion of the first backside metal layer.

23. The method of claim 11, wherein the transistor is a FinFET or Gate-All-Around (GAA) device.

24. The method of claim 11, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

\* \* \* \* \*